(12) United States Patent
Bates et al.

(10) Patent No.: US 8,210,904 B2
(45) Date of Patent: Jul. 3, 2012

(54) SLURRYLESS MECHANICAL PLANARIZATION FOR SUBSTRATE RECLAMATION

(75) Inventors: Graham M. Bates, Waterbury, VT (US); David Domina, Cambridge, VT (US); James L. Hardy, Jr., Essex Junction, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 1100 days.

(21) Appl. No.: 12/111,276

(22) Filed: Apr. 29, 2008

(65) Prior Publication Data

US 2009/0270017 A1    Oct. 29, 2009

(51) Int. Cl.
*B24B 1/00* (2006.01)
(52) U.S. Cl. .............. 451/41; 451/59; 451/63
(58) Field of Classification Search .......... 451/41, 451/63, 59; 438/465, 500, 691
See application file for complete search history.

(56) References Cited

U.S. PATENT DOCUMENTS

| | | | |
|---|---|---|---|
| 5,291,693 A | 3/1994 | Nguyen | |
| 5,622,875 A | 4/1997 | Lawrence | |
| 6,140,211 A * | 10/2000 | Nanda et al. | 438/465 |
| 6,547,647 B2 | 4/2003 | Chang | |
| 6,612,912 B2 | 9/2003 | Yasui et al. | |
| 6,635,500 B2 | 10/2003 | Lewis | |
| 6,818,031 B2 | 11/2004 | Oshima | |
| 6,866,560 B1 | 3/2005 | Follstaedt et al. | |
| 6,884,634 B2 | 4/2005 | Suzuki et al. | |
| 7,275,311 B2 | 10/2007 | Markevitch et al. | |
| 7,323,414 B2 | 1/2008 | Schowalter et al. | |
| 2002/0086539 A1 | 7/2002 | Falster | |
| 2003/0219957 A1 | 11/2003 | Kuwabara et al. | |
| 2004/0236533 A1 | 11/2004 | Beinglass et al. | |
| 2005/0092349 A1 | 5/2005 | Suzuki et al. | |
| 2005/0248004 A1 | 11/2005 | Chang et al. | |
| 2005/0250277 A1 | 11/2005 | Chang et al. | |
| 2006/0255314 A1 | 11/2006 | Suzuki et al. | |
| 2007/0007245 A1 | 1/2007 | Uchida et al. | |

* cited by examiner

*Primary Examiner* — Robert Rose
(74) *Attorney, Agent, or Firm* — Scully, Scott, Murphy & Presser, P.C.; Richard M. Kotulak, Esq.

(57) ABSTRACT

A patterned portion of a patterned semiconductor substrate is removed by abrasive mechanical planarization employing an abrasive pad but without employing any slurry. Preferably, water is supplied to enhance the removal rate during the mechanical planarization. The removal rate of material is substantially independent for common materials employed in back-end-of-line (BEOL) semiconductor materials, which enables non-selective removal of the material containing metallization structures. The removal rate of silicon is lower than the removal rate for the BEOL semiconductor materials, enabling a self-stopping planarization process.

28 Claims, 3 Drawing Sheets

SLURRYLESS MECHANICAL PLANARIZATION FOR SUBSTRATE RECLAMATION

FIELD OF THE INVENTION

The present invention relates to a method of processing a semiconductor substrate, and more particularly to a method of removing patterns from a surface of a semiconductor substrate by mechanical planarization without employing slurry.

BACKGROUND OF THE INVENTION

Disposal of patterned semiconductor substrates, including patterned product substrates that do not meet wafer acceptance criteria (WAC) and patterned monitor substrates, pose two types of challenges. On one hand, the patterned semiconductor substrates contain patterned physical features of circuits or devices that are protected by intellectual property. Disposal of such patterned semiconductor substrates may expose the intellectual property to an inadvertent unwanted disclosure. On the other hand, the patterned semiconductor substrate typically contains environmentally hazardous material such as boron, gallium, indium, arsenic, antimony, etc. Uncontrolled release of such environmentally hazardous material in the patterned semiconductor substrate may result in environmental contamination, of which the remedy can be extremely costly.

A conventional remedy to these problems has been to crush the patterned semiconductor substrates into fine powders so that the microelectronic features in the patterned semiconductor substrates are destroyed. The fine powders from the patterned semiconductor substrate are thereafter put in a sealed container, which may be buried in a designated location to minimize the environmental impact.

Recent efforts to reduce the environmental impact and reduce processing cost of substrate crushing and containment have resulted in methods for substrate reclamation. The patterned portion of a patterned semiconductor substrate is removed. The resulting semiconductor substrate, which does not contain any pattern, is a reclaimed semiconductor substrate that may be employed in semiconductor processing as a monitor substrate or a dummy substrate.

According to prior art, chemical stripping may be employed to remove a patterned portion of a patterned semiconductor substrate. In this method, a chemical is employed to dissolve soluble materials, while insoluble materials are undercut and subsequently removed. However, the dissolution rates across common materials employed in the patterned semiconductor substrates, e.g., silicon oxide, silicon nitride, low-k dielectric materials, polyimide, copper, aluminum, silicon, etc., vary by orders of magnitude. The variations in the dissolution rates typically cause paths to open up down to a surface of a semiconductor layer before the entirety of a back-end-of-line (BEOL) stack including metallization structures are undercut. Such paths cause extensive loss of the semiconductor material in the semiconductor layer. Further, the chemicals employed in chemical stripping tend to be extremely corrosive with accompanying environmentally adverse impacts. For these reasons, chemical stripping tends to consume a large amount of semiconductor material in a semiconductor layer, form large cavities on the surface of the reclaimed semiconductor substrate, contain some incompletely removed structures, and/or cause significantly negative environmental impacts.

An alternate prior art method includes chemical mechanical planarization (CMP) to remove a patterned portion of a patterned semiconductor substrate. A polishing slurry is employed in chemical mechanical planarization to provide selective removal of one material relative to another material. The polishing slurry may be acidic or alkaline. Examples of the polishing slurry include aluminum oxide and fumed silica. The pH of the polishing slurry during chemical mechanical planarization may be adjusted by adding a chemical, e.g., hydrogen peroxide, an alkali metal hydroxide, or ammonia. The removal rate of chemical mechanical planarization depends on the material being removed and the selection of the slurry. Since the composition of material in patterned semiconductor substrate varies significantly, the local polish rate will depend on the material and amount of material present, causing significant differences in polish rate across the wafer. For this reason, uniform removal rate is difficult to achieve with chemical mechanical planarization on all patterned semiconductor substrates, and normally requires chemical stripping to remove materials with low polish rates, as well as the chemical mechanical polish itself. Further, the chemical mechanical planarization requires a polishing slurry, which is a consumable material that needs to be supplied during the CMP process, to enable removal of the material in the patterned portion. In addition, the removed material is mixed with the residual slurry to produce contaminated liquid chemical waste, which is difficult to neutralize for environmental purposes.

Prior art methods employing mechanical removal include grinding of material for reclamation of substrates. Such mechanical removal results in generation of a damaged layer on a reclaimed semiconductor substrate. The surface topography of such reclaimed semiconductor substrate contains significant irregularity after removal of a patterned portion. To remove variations in the topography of the surface, as well as crystal defects extending well into the silicon lattice of the reclaimed semiconductor substrate after such mechanical removal, an additional chemical etching step and lapping to remove bulk silicon steps need to be employed.

In view of the above, there exists a need for a method of removing a patterned portion of a patterned semiconductor substrate at a uniform, material-independent rate without generating significant surface topography or crystal defects to reclaim the patterned semiconductor substrate.

Further, there exists a need for a method of removing the patterned portion of the patterned semiconductor substrate without employing slurry or generating a slurry-containing liquid chemical waste.

Yet further, there exist a need for a method of removing the patterned portion of the patterned semiconductor substrate with sufficient planarity to obviate any need for employing an additional chemical etch step or a lapping step.

SUMMARY OF THE INVENTION

To address the needs described above, the present invention provides a slurry-less mechanical planarization that removes a patterned portion of a patterned semiconductor substrate at a substantially uniform removal rate without employing slurry or generating a slurry-containing liquid chemical waste.

In the present invention, a patterned portion of a patterned semiconductor substrate is removed by abrasive mechanical planarization employing an abrasive pad but without employing any slurry. Preferably, water is supplied for lubrication during the mechanical planarization. The removal rate of material is substantially independent for common materials employed in back-end-of-line (BEOL) semiconductor materials, which enables non-selective removal of the material containing metallization structures. The removal rate of silicon is lower than the removal rate for the BEOL semiconductor materials, enabling a self-stopping planarization process.

According to the present invention, a method of removing material from a patterned semiconductor substrate is provided. The method comprises removing a patterned portion of a patterned semiconductor substrate employing an abrasive mechanical planarization without employing slurry.

In one embodiment, a remaining portion of the patterned semiconductor substrate after the abrasive mechanical planarization does not contain any patterned structure.

In another embodiment, the patterned semiconductor substrate includes a bulk semiconductor substrate, a semiconductor-on-insulator (SOI) substrate, or a hybrid semiconductor substrate comprising a bulk portion and a semiconductor-on-insulator (SOI) portion.

In even another embodiment, the patterned portion includes at least one semiconductor device located in a semiconductor layer.

In yet another embodiment, the patterned portion includes at least one metal interconnect structure comprising at least one conductive structure and at least one dielectric structure. The patterned semiconductor substrate may include a silicon layer located underneath the patterned portion. A first removal rate of material of the at least one metal interconnect structure may be greater than a second removal rate of material of the silicon layer. Removal of the at least one metal interconnect structure may be non-selective between metallic materials and dielectric materials. The at least one metal interconnect structure may be removed selective to silicon. The method may further comprise removing a top portion of the silicon layer by about 1 μm to about 10 μm during the abrasive mechanical planarization.

In still another embodiment, an abrasive pad containing abrasive particles having a diameter from about 1 μm to about 20 μm is employed during the abrasive mechanical planarization.

In still yet another embodiment, a surface of a remaining portion of the patterned semiconductor substrate contains no pattern, and contains structural damages having a depth from about 5 μm to about 10 μm.

In a her embodiment, an abrasive pad containing abrasive particles is employed during the abrasive mechanical planarization, and wherein the abrasive particles have a hardness greater than 8 Mohs.

In an even further embodiment, an abrasive pad containing abrasive particles is employed during the abrasive mechanical planarization, and wherein the abrasive particles are embedded in a plastic, erodible matrix.

In a yet further embodiment, the plastic erodible matrix comprises polycarbonate or polyurethane.

In a still further embodiment, an abrasive pad containing impregnated diamond particles is employed during the abrasive mechanical planarization. The impregnated diamond particles may have a diameter from about 3 μm to about 9 μm.

In a still yet further embodiment, water is added to a surface at which removal of material occurs during the abrasive mechanical planarization. Preferably, the water is deionized water consisting essentially of $H_2O$. Water may be added at a flow rate from about 10 milliliter per minute to about 300 milliliter per minute.

In further another embodiment, the abrasive mechanical planarization is performed by pressing the patterned semiconductor substrate in rotation against an abrasive pad affixed to a platen in rotation. The patterned semiconductor substrate may be held by a chuck which rotates with the patterned semiconductor substrate with a same angular velocity. The angular velocity may be from about 10 rpm to about 150 rpm, and wherein the rotating platen rotates with another angular velocity from about 10 rpm to about 150 rpm. Pressure from 0 psi to about 9.5 psi may be applied to a backside of the patterned semiconductor substrate. down force on a surface of the patterned semiconductor substrate contacting the platen may be from about 1 psi to 10 psi. The abrasive mechanical planarization may have a polish time from about 15 seconds to about 120 seconds.

DETAILED DESCRIPTION OF THE INVENTION

Figure 1:
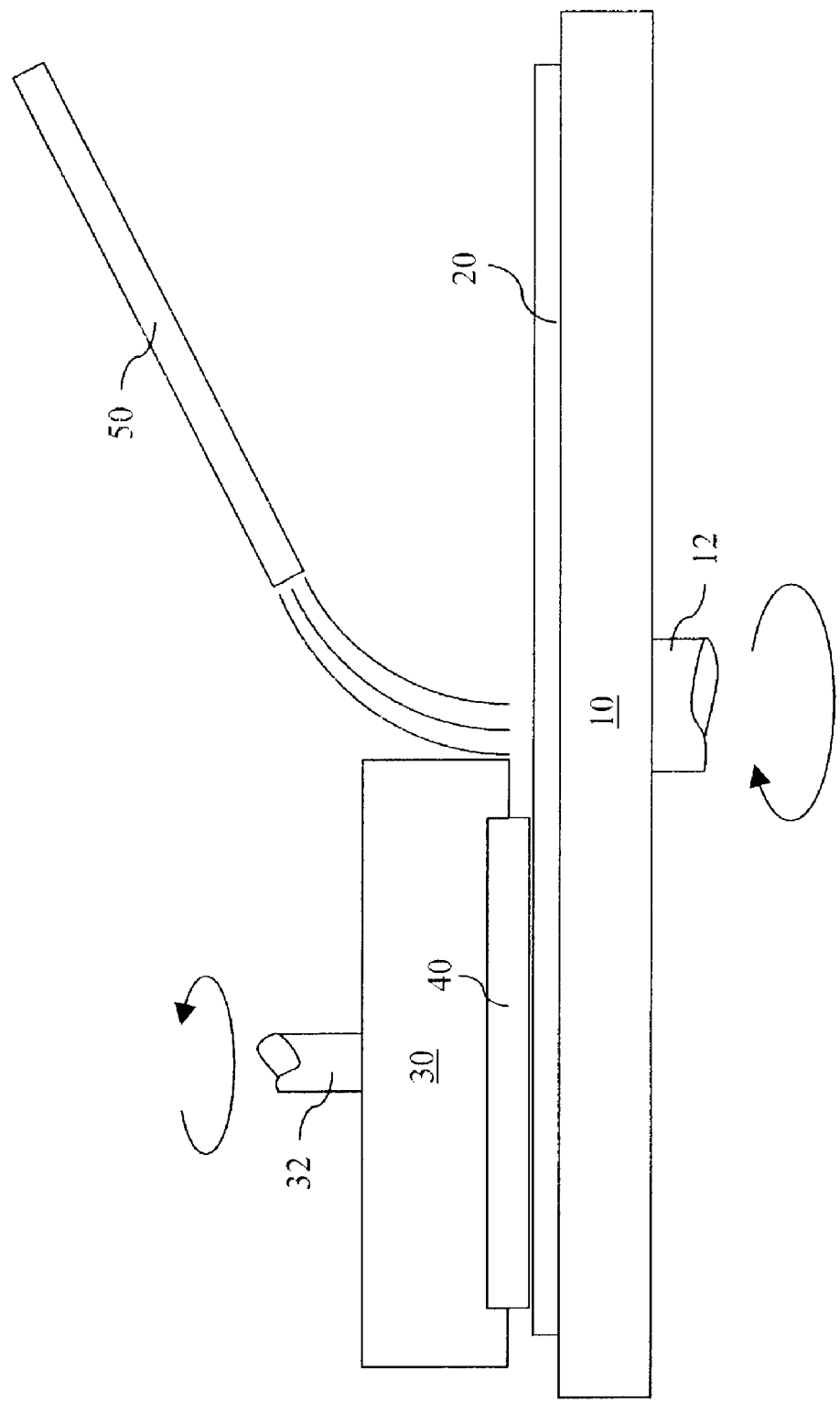
FIG. 1 is a vertical cross-sectional view of an exemplary abrasive mechanical planarization system according to the present invention.

As stated above, the present invention relates to a method of removing patterns from a surface of a semiconductor substrate by mechanical planarization without employing slurry. As used herein, when introducing elements of the present invention or the preferred embodiments thereof the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, an exemplary abrasive mechanical planarization system according to the present invention comprises a platen 10 and a platen shaft 12 that are configured to rotate around the axis of the platen shaft 12. Preferably, the platen shaft 12 and the platen 10 are concentric. The platen 10 may have a horizontal cross-sectional area of a circle having a first diameter, which is greater than the diameter of a patterned semiconductor substrate 40 to be planarized. Typically, a top surface of the platen 10 is substantially horizontal and configured to hold an abrasive pad 20. The abrasive pad 20 is affixed to the top surface of the platen 10, for example, by adhesion or by clipping.

A chuck 30 and a chuck shaft 32 are configured to rotate around the axis of the chuck shaft 32. Preferably, the chuck 30 and the chuck shaft are concentric. The chuck 30 may have a horizontal cross-sectional area of a circle having a second diameter, which is less than the first diameter, i.e., the diameter of the platen 10, and is greater than the diameter of the patterned semiconductor substrate 40. The bottom surface of the chuck 30 is substantially horizontal and parallel to the top surface of the abrasive pad 20. The bottom surface of the chuck 30 is provided with a mechanism, such as a vacuum suction, to hold the patterned semiconductor substrate 40. The patterned semiconductor substrate 40 is affixed to the bottom surface of the chuck 30 such that the patterned portion of the patterned semiconductor substrate 40 faces downward to contact the abrasive pad 20 and an unpatterned portion of the patterned semiconductor substrate 40 faces upward.

A hose 50 or an equivalent liquid spray mechanism is provided over the abrasive pad 20 and to the side of the chuck 30 so that water may be sprayed onto the top surface of the abrasive pad 20. The hose 50 may be connected to a flow control system such as a mass flow controller (not shown) or a flow switch (not shown).

The platen 10 and the abrasive pad 20 are rotated at a first angular velocity around the axis of the platen 10, which coincides with the axis of the platen shaft 12. The first angular velocity may be from about 10 revolutions per minute (rpm) to about 150 revolutions per minute, although lesser and greater first angular velocities are explicitly contemplated herein. The revolution of the platen 10 and the abrasive pad 20 may be clockwise or counterclockwise. The chuck 30 and the patterned semiconductor substrate 40 are rotated at a second angular velocity around the axis of the chuck 30, which coincides with the axis of the chuck shaft 32. The second angular velocity may be from about 10 rpm to about 150 rpm, although lesser and greater second angular velocities are explicitly contemplated herein. The revolution of the chuck 30 and the patterned semiconductor substrate 40 may be clockwise or counterclockwise. Typically, the direction of rotation of the platen 10 and the direction of rotation of the chuck 30 are opposite, i.e., if the platen 10 rotates clockwise, the chuck 30 rotates counterclockwise, and vice versa. Typically, the axis of the platen 10 and the axis of the chuck 30 are offset to provide uniform removal rate of the bottom surface, i.e., the surface contacting the pad 20, of the patterned semiconductor substrate 40.

The abrasive pad 20 contains abrasive particles. Preferably, the abrasive particles have a hardness greater than 8 Mohs. Non-limiting examples of materials that may be employed for the abrasive particles include diamond, fullerite, carborundum, corundum, aluminum silicate, etc. Typically, the abrasive pad 20 contains a matrix containing the abrasive particles. The matrix comprises a material having less hardness and greater flexibility than the material of the abrasive particles. In one case, the abrasive pad 20 may contain a plastic erodible matrix in which the abrasive particles are embedded. The plastic matrix may comprise, for example, polycarbonate, polyurethane, or any single or combination of plastic materials which form a stiff matrix which the abrasive particles can adhere. The diameter of the abrasive particles may be from about 1 μm to about 20 μm, although lesser and greater diameters are also contemplated herein. In one embodiment, the abrasive particles comprise impregnated diamond particles having a hardness of about 10 Mohs. The diameter of the impregnated diamond particles may be from about 3 μm to about 9 μm, although lesser and greater diameters are also contemplated herein.

Abrasive mechanical planarization is performed on the bottom surface of the patterned semiconductor substrate 40, which contains a patterned portion that contacts the abrasive pad 20. The present invention employs non-chemical abrasive mechanical planarization in that chemical that reacts with the material of the patterned semiconductor substrate is not employed. Further, slurry is not employed in the non-chemical abrasive mechanical planarization of the present invention. Instead, water is supplied to enhance the removal rate of the material from the patterned semiconductor substrate 40. Further, water acts as a coolant and lubricant during the non-chemical abrasive mechanical planarization to prevent overheating of the abrasive pad 20.

Specifically, water is added to the surface at which removal of material occurs during the abrasive mechanical planarization of the present invention. Typically, water is added near the center of the platen 10, from which the water flows out toward the rim of the platen 10 by centrifugal force. As the water flows outward, the water laterally enters the area at which the patterned semiconductor substrate 40 contacts the abrasive pad 20. Since the abrasive pad 20 includes abrasive particles that protrude from the surface of a matrix of the abrasive pad 20, the water laterally flows between the abrasive pad 20 and the bottom surface of the patterned semiconductor substrate 40.

Preferably, the water is deionized water with minimal level of impurities and consisting essentially of water molecules, i.e., $H_2O$ molecules. Preferably, the impurities in the deionized water are at a trace level, if any. The water is chemically neutral, i.e., has a pH of 7.0. The water is added at a flow rate from about 10 milliliters per minute to about 300 milliliters per minute, and typically, from about 25 milliliters per minute to about 150 milliliters per minute, although lesser and greater water flow rates are also contemplated herein.

The abrasive mechanical planarization of the present invention is performed by pressing the patterned semiconductor substrate 40 in rotation against the abrasive pad 20 affixed to the platen 10 in rotation. The patterned semiconductor substrate 40 is held by the chuck 30 which rotates with the patterned semiconductor substrate 30 at the same angular velocity. Pressure from 0 pound per square inch (psi) to about 9.5 psi may be applied to the backside of the patterned semiconductor substrate 40 that contact the chuck 30, although greater pressure is also contemplated herein. Down force on the surface of the patterned semiconductor substrate 40 that contact the abrasive pad 20 may be from about 1 psi to about 10 psi, although lesser and greater down forces are contemplated herein also. The duration of the abrasive mechanical planarization, i.e., the polish time, varies depending on the thickness of the patterned portion of the patterned semiconductor substrate 40, and is typically from about 15 seconds to about 120 seconds, although lesser and greater polish times are also contemplated herein.

It is noted that apparatus for chemical mechanical planarization (CMP) may be readily converted to perform the process of the present invention by removing a slurry supply system and adding a water supply system.

Figure 2:
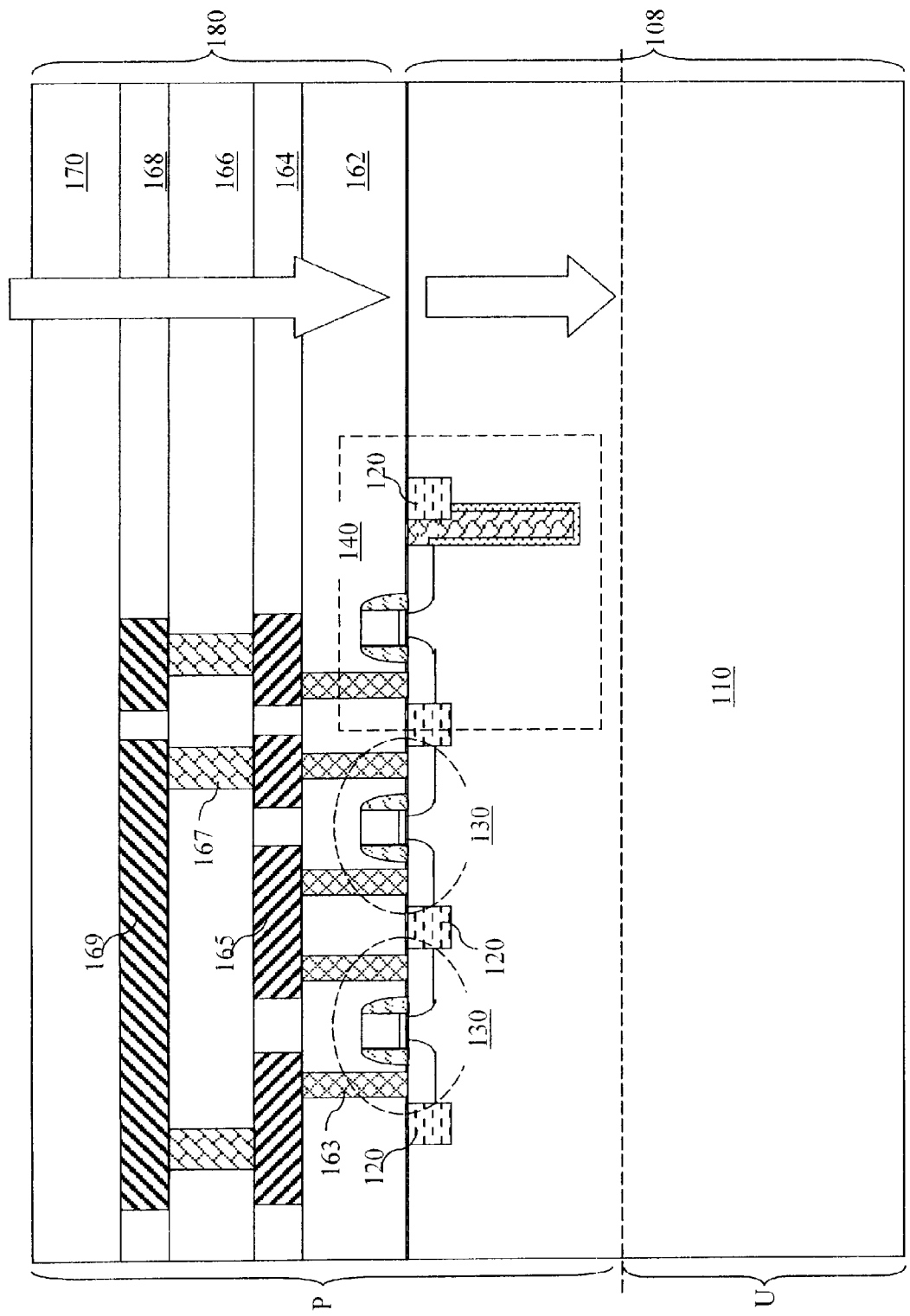
FIG. 2 is a vertical cross-sectional view of a first exemplary patterned semiconductor substrate that may be planarized by the methods of the present invention.

Referring to FIG. 2, a first exemplary patterned semiconductor substrate that may be planarized by the methods of the present invention comprises a semiconductor-based portion 108 and an interconnect structure portion 180 formed on the semiconductor-based portion 108. The semiconductor-based portion 108 may comprise a bulk semiconductor substrate containing the semiconductor layer 110 without a pattern therein, in which semiconductor devices are embedded in subsequent processing steps. The interconnect structure portion 180 and an upper portion of the semiconductor-based portion 108 containing semiconductor devices collectively constitute a patterned portion P. The remaining lower portion of the semiconductor-based portion 108, which does not contain any patterned structure and contains a lower portion of the semiconductor layer 110, constitutes an unpatterned portion U.

Typically, the upper portion of the semiconductor-based portion 108 comprises at least one semiconductor device, which may include a logic device 130 or a memory device 140. Shallow trench isolation structures 120 may also be present in the upper portion of the semiconductor-based portion 108 to provide electrical isolation in case a plurality of semiconductor devices are embedded in the upper portion of the semiconductor layer 110. The shallow trench isolation structures 120 may be provided, for example, by formation of a dielectric pad layer (not shown) over the semiconductor layer 110, application and lithographic patterning of a photoresist (not shown), an anisotropic etch that transfers the pattern in the photoresist into exposed portions of the semiconductor layer 10 to form shallow trenches, deposition of a dielectric material inside the shallow trench, and planarization of the dielectric material. The depth of the shallow trench isolation structures 120 is typically less than 1 μm. The top portion of the semiconductor-based portion 108 may contain other device structures such as a deep trench, which may have a depth up to about 8 μm. In general, the depth of patterned structures included in the top portion of the semiconductor layer 110 is typically limited to a depth less than 10 μm from the top surface of the semiconductor layer 110.

Non-limiting examples of semiconductor materials that may be employed for the semiconductor layer 110 include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. In one embodiment, silicon is the semiconductor material of the semiconductor layer 110.

The at least one semiconductor devices in the upper portion of the semiconductor-based portion 108 may include dielectric materials, semiconductor materials, and metallic materials. The dielectric materials include, but are not limited to, silicon oxide, silicon nitride, silicon oxynitride, high dielectric constant material comprising a dielectric metal oxide, etc. The semiconductor materials include, but are not limited to, the above mentioned materials that may be employed for the semiconductor layer 110. The metallic materials include, but are not limited to, Cu, Al, W, Ta, Ti, TaN, TiN, WN, Co, Ni, Pt, and metal semiconductor alloys. Typically, the semiconductor-based portion 108 predominantly comprises semiconductor materials.

The interconnect structure portion 180 comprises at least one metal interconnect structure comprising at least one conductive structure and at least one dielectric structure. The at least one dielectric structure may include at least one of a contact via level dielectric layer 162, a first line level dielectric layer 164, a first via level dielectric layer 166, a second line level dielectric layer 168, a dielectric passivation layer 170, any other via level dielectric layer (not shown), and any other line level dielectric layer (not shown). The at least one conductive structure may include at least one of contact vias 168, first line level conductive structures 166, first interconnect vias 167, second line level conductive structures 169, any other interconnect level vias (not shown), and any other line level conductive structures (not shown). Line level interconnect structures may comprise interconnect lines.

Each of the at least one dielectric structure comprises a dielectric material, non-limiting examples of which include silicon oxide, silicon nitride, SiCOH, chemical vapor deposition (CVD) low-k dielectric materials, spin-on low-k dielectric materials, etc. Each of the at least one conductive structure comprises a conductive material such as metal, e.g., Cu or Al, or a conductive metallic alloy.

The first exemplary patterned semiconductor substrate (108, 180) may be loaded onto the chuck 30 of the exemplary abrasive mechanical planarization system of FIG. 1 such that the bottom surface of the semiconductor-based portion 108 contacts the chuck 30 and the top surface of the interconnect structure portion 180 faces downward. During the abrasive mechanical planarization, the exposed surface of the interconnect structure portion 180 is continually removed by abrasion as the abrasive particles on the abrasive pad 20 applied force to the material on the exposed surface of the interconnect structure. In the course of experiments that led to the present invention, it has been found that the removal rate of materials is non-selective between metallic materials and dielectric materials. Thus, the entirety of the interconnect structure portion 180 including the at least one metal interconnect structure may be removed non-selectively between the metallic materials and the dielectric materials.

In one embodiment, the semiconductor layer 110 comprises silicon, i.e., the semiconductor layer 110 is a silicon layer. Typically, the removal rate of silicon is less than the removal rate of the interconnect structure portion 180 including the at least one metal interconnect structure. In this case, the interconnect structure portion 180 including the at least one metal interconnect structure may be removed selective to silicon. The removal rate of the at least one metal interconnect structure, which is herein referred to as a first removal rate, is greater than the removal rate of silicon, which is herein referred to as a second removal rate.

After a complete removal of the interconnect structure portion 180, which is schematically represented by an upper arrow in FIG. 2, a top portion of the semiconductor layer 110 is removed to depth below which no patterned structure is present. The depth may be from about 1 μm to about 10 μm depending on the type of semiconductor devices contained in the semiconductor-based portion 108. After removal of the top portion of the semiconductor-based portion 108, the remaining portion of the semiconductor-based portion 108 constitutes an unpatterned semiconductor substrate, which is a reclaimed semiconductor substrate. The thickness of the reclaimed semiconductor substrate may be less than the thickness of the patterned semiconductor substrate (108, 180) prior to the abrasive mechanical planarization by a thickness from about 1 μm to about 30 μm, and typically from about 1 μm to about 10 μm. Thus, the thickness of the reclaimed semiconductor substrate may be about 99% of the thickness of the patterned semiconductor substrate (108, 180) prior to the abrasive mechanical planarization or more.

Figure 3:
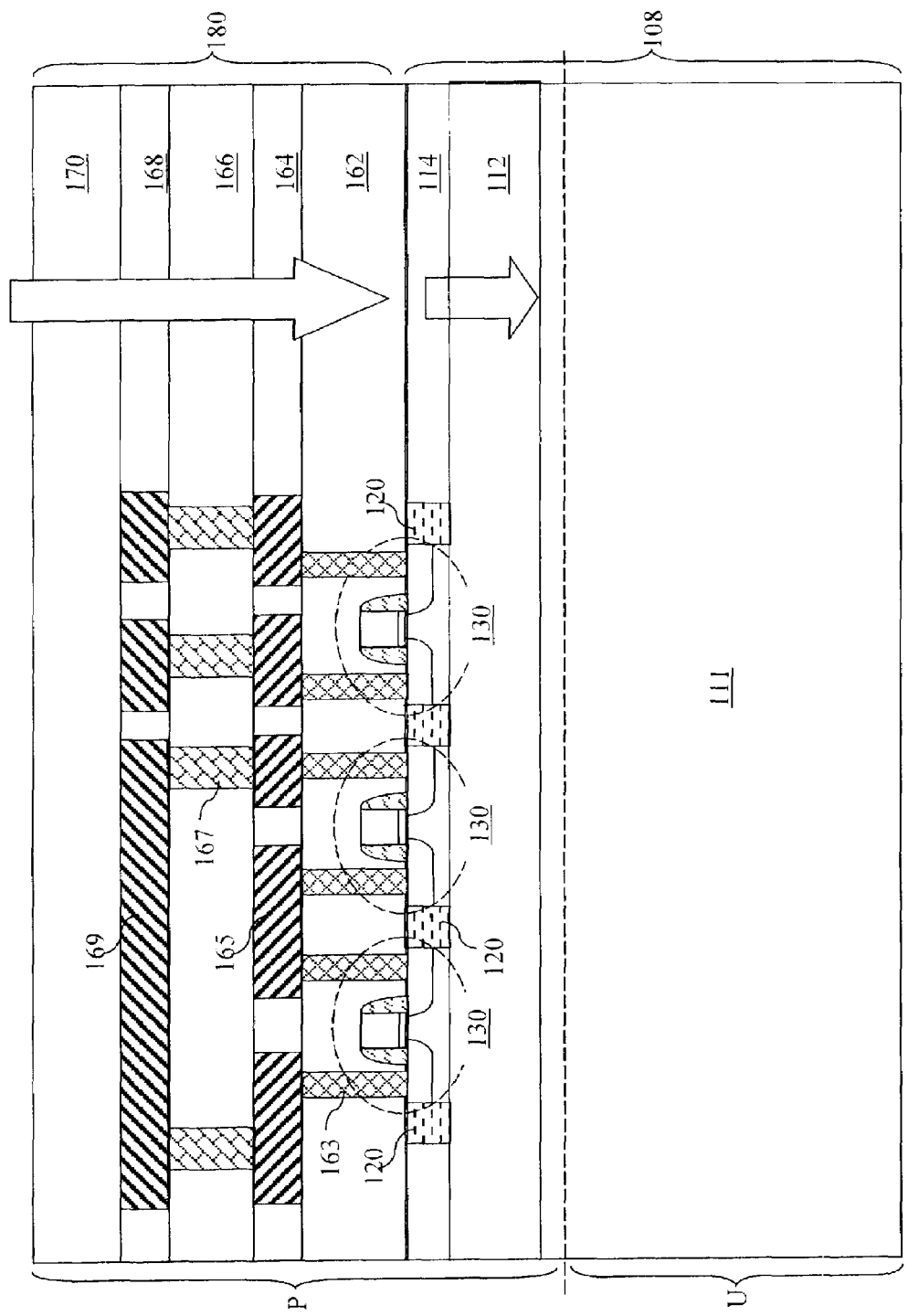
FIG. 3 is a vertical cross-sectional view of a second exemplary patterned semiconductor substrate that may be planarized by the methods of the present invention.

Referring to FIG. 3, a second exemplary patterned semiconductor substrate that may be planarized by the methods of the present invention comprises a semiconductor-based portion 108 and a interconnect structure portion 180 formed on the semiconductor-based portion 108. The semiconductor-based portion 108 may comprise a semiconductor-on-insulator (SOI) substrate containing a bottom semiconductor layer 111 without a pattern therein, a buried insulator layer 112, and a top semiconductor layer 114 in which semiconductor devices are embedded in subsequent processing steps. The interconnect structure portion 180 and an upper portion of the semiconductor-based portion 108 containing semiconductor devices collectively constitute a patterned portion P as in the first exemplary patterned semiconductor substrate. The bottom semiconductor layer 111, which does not contain any patterned structure, constitutes an unpatterned portion U.

The abrasive mechanical planarization process of the present invention may be employed in the same manner described above.

The present invention may be employed to reclaim other patterned semiconductor substrates such as a patterned hybrid substrate including a bulk portion and a semiconductor-on-insulator portion. Further, in some cases, a bottom semiconductor layer of a patterned semiconductor substrate may contain a pattern such as deep trenches, in which case the depth of the abrasive mechanical planarization is adjusted to insure removal of all patterned structures from the patterned semiconductor substrate.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of removing material from a patterned semiconductor substrate, said method comprising removing a patterned portion of a patterned semiconductor substrate employing an abrasive mechanical planarization without employing slurry, wherein an abrasive pad including a matrix embedding abrasive particles is employed during said abrasive mechanical planarization, and said matrix comprises a material having less hardness and greater flexibility than a material of said abrasive particles.

2. The method of claim 1, wherein a remaining portion of said patterned semiconductor substrate after said abrasive mechanical planarization does not contain any patterned structure.

3. The method of claim 1, wherein said patterned semiconductor substrate includes a bulk semiconductor substrate, a semiconductor-on-insulator (SOI) substrate, or a hybrid semiconductor substrate comprising a bulk portion and a semiconductor-on-insulator (SOI) portion.

4. The method of claim 1, wherein said patterned portion includes at least one semiconductor device located in a semiconductor layer.

5. The method of claim 1, wherein said patterned portion includes at least one metal interconnect structure comprising at least one conductive structure and at least one dielectric structure.

6. The method of claim 5, wherein said patterned semiconductor substrate includes a silicon layer located underneath said patterned portion.

7. The method of claim 6, wherein a first removal rate of material of said at least one metal interconnect structure is greater than a second removal rate of material of said silicon layer.

8. The method of claim 6, wherein removal of said at least one metal interconnect structure is non-selective between metallic materials and dielectric materials.

9. The method of claim 8, wherein said at least one metal interconnect structure is removed selective to silicon.

10. The method of claim 6, further comprising removing a top portion of said silicon layer by about 1 µm to about 10 µm during said abrasive mechanical planarization.

11. The method of claim 1, wherein a surface of a remaining portion of said patterned semiconductor substrate contains no pattern, and contains structural damages having a depth from about 5 µm to about 10 µm.

12. The method of claim 1, wherein said abrasive particles have a hardness greater than 8 Mohs.

13. A method of removing material from a patterned semiconductor substrate, said method comprising removing a patterned portion of a patterned semiconductor substrate employing an abrasive mechanical planarization without employing slurry, wherein an abrasive pad containing abrasive particles is employed during said abrasive mechanical planarization, and wherein said abrasive particles are embedded in a plastic erodible matrix.

14. The method of claim 13, wherein said plastic erodible matrix comprises polycarbonate or polyurethane.

15. The method of claim 1, wherein said abrasive particles comprise impregnated diamond particles.

16. The method of claim 15, wherein said impregnated diamond particles have a diameter from about 3 µm to about 9 µm.

17. The method of claim 16, wherein water is added to a surface at which removal of material occurs during said abrasive mechanical planarization.

18. The method of claim 1, wherein water is added to a surface at which removal of material occurs during said abrasive mechanical planarization.

19. The method of claim 18, wherein said water is deionized water.

20. The method of claim 18, wherein water is added at a flow rate from about 10 milliliter per minute to about 300 milliliter per minute.

21. The method of claim 1, wherein said abrasive mechanical planarization is performed by pressing said patterned semiconductor substrate in rotation against an abrasive pad affixed to a platen in rotation.

22. The method of claim 21, wherein said patterned semiconductor substrate is held by a chuck which rotates with said patterned semiconductor substrate with a same angular velocity.

23. The method of claim 22, wherein said angular velocity is from about 10 rpm to about 150 rpm, and wherein said rotating platen rotates with another angular velocity from about 10 rpm to about 150 rpm.

24. The method of claim 21, wherein pressure from 0 psi to about 9.5 psi is applied to a backside of said patterned semiconductor substrate.

25. The method of claim 21, wherein down force on a surface of said patterned semiconductor substrate contacting said platen is from about 1 psi to 10 psi.

26. The method of claim 21, wherein said abrasive mechanical planarization has a polish time from about 15 seconds to about 120 seconds.

27. A method of removing material from a patterned semiconductor substrate, said method comprising removing a patterned portion of a patterned semiconductor substrate employing an abrasive mechanical planarization without employing slurry, wherein a remaining portion of said patterned semiconductor substrate after said abrasive mechanical planarization does not contain any patterned structure, wherein said patterned portion includes at least one semiconductor device located in a semiconductor layer, wherein said patterned portion includes at least one metal interconnect structure comprising at least one conductive structure and at least one dielectric structure, wherein an abrasive pad including a matrix embedding abrasive particles is employed during said abrasive mechanical planarization, and said matrix comprises a material having less hardness and greater flexibility than a material of said abrasive particles, wherein water is added to a surface at which removal of material occurs during said abrasive mechanical planarization, and wherein said abrasive mechanical planarization is performed by pressing said patterned semiconductor substrate in rotation against a rotating platen.

28. The method of claim 1, wherein said matrix is a plastic erodible matrix.

* * * * *